United States Patent [19]

Helbig et al.

[11] 4,240,070

[45] Dec. 16, 1980

[54] VARIABLE DIGITAL TO ANALOG CONVERTER

[75] Inventors: Klaus Helbig, Zeist, Netherlands; Eike Rietsch, Celle-Wietzenbruch, Fed. Rep. of Germany

[73] Assignee: Deutsche Texaco Aktiengesellschaft, Hamburg, Fed. Rep. of Germany

[21] Appl. No.: 59,089

[22] Filed: Jul. 19, 1979

Related U.S. Application Data

[63] Continuation of Ser. No. 843,926, Oct. 20, 1977, abandoned, which is a continuation-in-part of Ser. No. 588,535, Jun. 19, 1975, abandoned.

[30] Foreign Application Priority Data

Jun. 22, 1974 [DE] Fed. Rep. of Germany ....... 2430018

[51] Int. Cl.$^2$ ............................................ H03K 13/02
[52] U.S. Cl. ............................................ 340/347 DA
[58] Field of Search .................... 340/347 M, 347 DA

[56] References Cited

U.S. PATENT DOCUMENTS

| | | | |
|---|---|---|---|
| 3,458,859 | 7/1969 | Godfrey | 340/347 DA |
| 3,555,540 | 1/1971 | Hartke | 340/347 DA |
| 3,685,046 | 8/1972 | Howlett | 340/347 DA |

Primary Examiner—Charles D. Miller
Attorney, Agent, or Firm—Carl G. Ries; Ronald G. Gillespie

[57] ABSTRACT

The apparatus and method provides for an improvement to a system which converts wide amplitude range digital data recorded in floating point digital word form to analog signals within a limited amplitude range. The apparatus and method provides for the situation wherein the digital data can represent an analog signal for which on a general decrease in amplitude increases may be superimposed. The apparatus includes a digital/analog converter whose reference voltage is individually determined for each sample. This reference voltage is taken from a saw tooth oscillator at an instant of time determined by a delay timer which responds to changes, with respect to a desired average amplitude, of the actual amplitude of the converted data.

11 Claims, 7 Drawing Figures

VARIABLE DIGITAL TO ANALOG CONVERTER

REFERENCE TO RELATED APPLICATIONS

This application is a continuation of copending application Ser. No. 843,926; filed Oct. 20, 1977, and subsequently abandoned.

The copending application was a continuation-in-part of then copending application of the same inventors filed on June 19, 1975 under Ser. No. 588,535 and subsequently abandoned. Applicants now abandoned claim the benefit of the priority filing date of June 22, 1974 as to any subject matter which has been disclosed or claimed in said application Ser. No. 588,535.

BACKGROUND OF THE INVENTION

1. Field of the Invention

This invention pertains, in general, to making analog form playbacks from digitally recorded data (e.g. seismic data) which has been digitized from wide dynamic amplitude range analog form signals initially generated by transducers, such as geophones, in response to acoustically induced seismic disturbances; in particular, to the making of analog form playbacks such as oscillograms which are approximate but very useful reproductions in compressed range of the wide dynamic range amplitude-versus-time characteristic curves of the analog signal initially generated by the aforementioned transducers.

The aforementioned oscillograms may be made substantially simultaneously with the acquisition of the signals generated by the geophones; i.e., the system may function as a monitoring system. In the alternative, the oscillograms may be made at any convenient time after the acquisition of the signals generated by the geophones; i.e., the system may function as a playback system.

2. Brief Description of the Prior Art

In seismic exploration work each acoustically driven geophone generates wide dynamic amplitude range signals in analog form. When such signals are processed through a digital seismic recording system there is produced a high fidelity record in digital form covering the wide dynamic range of amplitudes of the seismic signals. The reason that the digital form record is referred to herein as a high fidelity record is because the signal amplitudes are recorded accurately throughout their wide dynamic range; e.g. many binary digit, or bit positions are used to precisely record the highest signal amplitude as well as the lowest where the range (i.e., the ratio of the highest signal amplitude to the lowest signal amplitude) may be of the order $10^6$.

The subject invention provides a method and apparatus for making analog form oscillograms from the recorded digital data. The oscillograms are of relatively lower fidelity than the aforementioned digitally recorded data. Although the oscillograms are of relatively lower fidelity serious distortions are, nevertheless, not introduced in reconverting the digital data to analog data for the purpose of making compressed amplitude range oscillograms.

The techniques to record, in digital form, wide dynamic amplitude range analog signals initially generated by geophones are disclosed in, among others, the following: U.S. Pat. No. 3,241,100 issued Mar. 15, 1966 in behalf of R. J. Loofbourrow and entitled "Digital Seismic Recording System"; U.S. Pat. No. 3,264,574 issued Aug. 2, 1966 on behalf of R. J. Loofbourrow and entitled "Amplifier System"; U.S. Pat. No. 3,603,972, which issued Sept. 7, 1971 to James R. Vanderford and is entitled "Amplifier System". The hitherto known techniques to make analog displays of such digitally recorded data are disclosed in, among others, the following: U.S. Pat. No. 3,685,046, which issued on Aug. 15, 1972 to Donald P. Howlett and is entitled "Seismic Playback/Monitor-System" and in U.S. Pat. No. 3,872,465, which issued on Mar. 18, 1975 to Robert J. Loofbourrow and is entitled "Seismic Playback/Monitor System".

In the aforementioned Patents of Vanderford and Howlett there is described a system wherein portions of an analog signal are converted to digital words wherein each digital word occupies a number of binary digit, or bit, positions. Moreover, each such digital word is recorded in floating point form. The floating point form of notation allows greater flexibility of operation and easier handling of numbers differing greatly in magnitude from each other. (See, for example, the textbook "Digital Computer Primer" by E. M. McCormick, 1959, published by McGraw-Hill Book Company, Inc., beginning at page 152.) In the system disclosed in the Vanderford and Howlett patent applications, hereinbefore identified, a floating point digital number, or word, in the form of a mantissa or argument, and an exponent is recorded on a suitable storage medium such as magnetic tape. The floating point digital word represents the instantaneous absolute seismic voltage amplitude as it is introduced to a floating point amplifier system. The dynamic range of the floating point word may be in excess of 200 dB, if necessary, to cover the dynamic range of input signal (equivalent to a digital number sonsisting of 36 binary digits, or bits).

As a specific example the floating point word as set forth in conventional algebraic form is as follows:

$$e_{in} = \pm AB^{-E} \qquad \text{(equation 1)}$$

wherein $e_{in}$ represents the absolute magnitude or amplitude of the floating point word; A represents the mantissa, or argument, portion of the word; B represents the base, or radix, of the number system used (B=10 in the decimal, or base 10, system or B=8 in the octal system); and E represents the exponent.

As is suggested in the patents hereinbefore identified, the floating point digital word is in the form $$Q = \pm AB^{-E} \qquad \text{(equation 2)}$$

wherein Q represents the absolute magnitude of the amplitude of the input signal delivered to an arrangement of amplifiers, each of which has a gain of eight (8) and hence the base B in equation 1 becomes 8 in equation 2; the mantissa A represents the output amplitude of a particular amplifier in the aforesaid arrangement; and E, the exponent, respresents the number of amplifier stages of gain of 8 through which the aforesaid input signal has been processed.

In order to record the floating point digital word of equation 2 in a binary register with, for example, 144 dB of dynamic range and with 14 binary digit, or bit, accuracy, 18 bit positions would be required where the mantissa A is represented in binary form (i.e., where the base, or radix, of such a number systemm is 2) and where the exponent E is also represented in binary form. Of the 18 bits required: one bit represents the sign allowing for bipolar input-output capabilities; 14 bits represent the mantissa A; and 3 bits represent the exponent E.

Although there are many advantages to recording seismic signals in digital form, there still remains the need to make available to a seismic prospector a visible display or recording of the seismic data, or portions thereof. Conventionally, the visible record is an oscillogram. Often, it is desirable for a seismic prospector in a seismic field crew in a location remote from a main data processing center to take a quick look at a portion of the seismic data from time to time. For example, a seismic prospector may wish to make some interpretations with respect to the oscillograms in order to coordinate such data with geological data.

It is an object of the present invention to overcome the difficulties and limitations recited above.

Accordingly one object of the invention is to convert data from digital form to analog form.

Another object of the invention is to provide new and useful methodology for converting data from digital form to analog form.

Another object of the invention is to provide new and useful apparatus for converting data from digital form to analog form.

Another object of the invention is to convert wide dynamic amplitude range digital data (e.g., seismic data) to analog form displays such as oscillograms, or wiggle traces.

Another object of the invention is to convert wide dynamic amplitude range digital data to analog form data as oscillograms which oscillograms are selectively compressed reproductions of wide dynamic amplitude range analog signals which existed prior to their conversion to said digital data.

Another object of the invention is to convert wide dynamic amplitude range digital form data to analog form data having selectively compressed amplitude without introducing serious distortions.

Another object of the present invention is to convert wide dynamic amplitude range digital form data where the average amplitude increases or decreases in arbitrary fashion that is not known beforehand.

The objects and advantages of the invention will appear more fully hereinafter from a consideration of the detailed description which follows, taken together with the accompanying drawings wherein one embodiment of the invention is illustrated by way of example. It is to be expressly understood however that the drawings are for illustrative purposes only and are not to be construed as defining the limits of the invention.

Although the invention is hereinafter described as being employed in conjunction with digital seismic recording systems such as those disclosed in the patents hereabove identified it is, nevertheless, to be understood that the invention's field of use is not processing.

DESCRIPTION OF THE INVENTION

Figure 1:
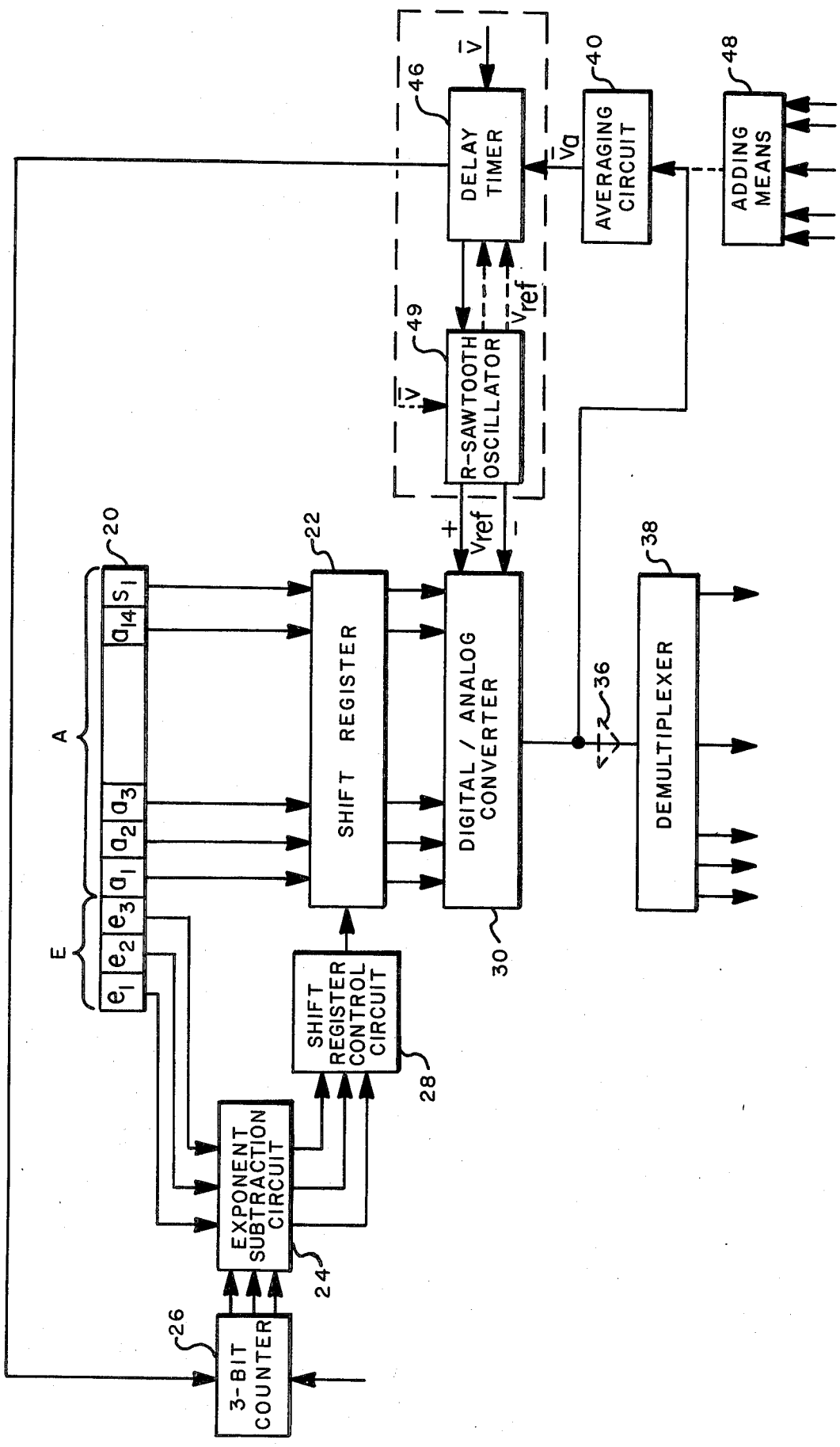
FIG. 1 is a simplified block diagram of a system, constructed in accordance with the present invention, for steplessly variable dynamic compression for play back and monitor recording of digital signals.

Digital values of signals with a wide dynamic range are usually represented as floating point numbers in the form $$Q = \pm AB^{-E}$$

in this expression A is a mantissa, B the base of the number system, and E is an exponent. Conventional values for the base B are, for example, 2, 4, 8, 10, 16. In the interests of clarity it will be occasionally assumed in this text that $B = 8$.

It is an essential characterizing feature of the method described in the aforementioned disclosure by R. J. Loofbourrow entitled "Seismic Playback/Monitor System" that a binary number K is generated and that the floating point number $Q' = \pm AB^{K-E}$ derived from Q is converted into a fixed point number. This fixed point number is then converted into an analog value.

The present invention proposes an improved method for converting and steplessly compressing digital values of signals with a wide dynamic range into analog signals and for subsequent visual display and monitoring purposes, each digital value being represented as floating point number in the form $$Q = \pm AB^{K-E}$$

wherein A represents a mantissa, B represents a radix—preferably 2,4,8,16—, E represents an exponent, and K represents a binary number—, subjecting said floating point number Q to a D/A-converter-, and providing a variable reference voltage $V_R$ for controlling the digital-analog conversion of said floating point number Q;

The method described hereinbefore provided for solving the problem comprises the steps of (1) periodically generating said reference voltage $V_R$ in a sawtooth oscillator in a manner that the amplitude rises from a predetermined minimum value $V_o$ to a predetermined maximum $BV_o$ value during each reference voltage cycle;

(2) synchronizing said reference voltage cycle in accordance with said conversion cycle so that the reference voltage is equal to an integer fraction of said conversion cycle;

(3) providing a voltage $V_{ref}$ taken from said voltage $V_R$ at an instant of time $\tau$, determined by a delay timer, within the reference voltage cycle, said instant of time being controlled either externally or by averages of the previously determined analog signal; and (4) supplying said voltage $V_{ref}$ of said reference voltage $V_R$ to a holding circuit for performing the digital-/analog conversion of said floating point number Q during said synchronized reference voltage cycle.

Reference voltage generator comprises a sawtooth oscillator, a delay circuit, and a holding circuit which can be integrated with the sawtooth oscillator.

The sawtooth oscillator delivers a periodic sawtooth voltage which rises exponentially from $V_o$ to $BV_o$, the letter B being the base used for the floating point number representation of the digitally stored data. For example, if the initial voltage $V_o$ of the sawtooth oscillator is equal to 1 volt and the base is $B = 8$, the voltage on the sawtooth oscillator within one cycle will rise from 1 volt to 8 volt.

The frequency of the sawtooth is equal to the inverse cycle time $\Delta t$, i.e. a new sawtooth is generated every $\Delta t$ seconds. The term "cycle time" refers to the time which elapses between the conversion of two digital numbers into corresponding analog values if data from only one channel are to be converted. If data from a plurality of channels (for example 24 or 48 channels) are to be simultaneously displayed by analog means as is common in seismology, the aforementioned term refers to the time which elapses between the conversion of two successive digital values of the same channel into analog values. If playback is simultaneous with recording, as is conventional practice for monitoring purposes in seismic prospecting, the cycle time will be identical with the sampling rate. This dependence on time of the sawtooth voltage $V_R(t)$ within one cycle can therefore be described by the equation $$V_R(t) = e^{\alpha t} \quad (1)$$

where $$\alpha = \ln 8/t, \text{ or generally } \alpha = \ln B/\Delta t \quad (2)$$

The voltage of the sawtooth oscillator is tapped at a specific time $\tau (0 \leq \tau \leq \Delta t)$ and is supplied to a holding circuit. The voltage thus obtained is used as $V_{ref}$. Any change of the delay $\tau$ therefore also alters the level of the reference voltage. When $\tau=0$, this voltage will be 1 $V_o$, when $\tau=\Delta t$ it will be $BV_o$ volts.

Since the aforementioned sawtooth oscillator is used to generate the reference voltage, it will be referred to hereinbelow as R-sawtooth oscillator (sawtooth reference voltage oscillator).

The time $\tau$ at which the reference voltage is taken from the sawtooth voltage is defined by means of a delay timer. The time depends on the average output voltage of the D/A converter, but it can also be externally controlled.

One possible embodiment of the delay timer comprises a voltage source with an adjustable constant voltage which represents the average D/A converter output voltage $\bar{V}$ which is optimum for playback. It also includes a sawtooth oscillator, referred to hereinbelow as V-sawtooth oscillator (sawtooth comparison voltage oscillator) whose voltage $V_V(t)$ drops linearly at the beginning of each cycle from $\bar{V}$ volt in accordance with the expression $$V_V(t) = \bar{V}(1 - \alpha t)$$

The parameter $\alpha$ is identical to that in the expression (2). A comparison voltage which diminishes with respect to time is formed from the sum of the average output voltage $\bar{V}$ and of the sawtooth voltage $V_V(t)$—reduced by a holding voltage $V_H'$ which will be explained subsequently. The delay time is reached as soon as the said comparison voltage is equal to the average output-voltage $\bar{V}_a$ of the digital/analog converter, i.e. as soon as $\bar{V} + \bar{V} \cdot (1 - \alpha \tau) = V_H' + \bar{V}_a$. A pulse transmitted at that time ensures that the instantaneous voltage $V_V(\tau)$ is taken from the V-sawtooth oscillator and is supplied to a holdin circuit. This voltage represents the holding voltage $V_H$ which is used in the next cycle (i.e. $V_H = \bar{V}(1 - \alpha \tau)$. The voltage across the R-sawtooth oscillator is simultaneously tapped and supplied to a holding circuit. During the next cycle this is used as reference voltage for D/A conversion.

It follows from this description that the delay refers to the time during which the voltage $V_V$ drops to $V_H'$ if $\bar{V} = \bar{V}_a$, i.e. the desired and actual average output voltages of the D/A converter are identical. However, since $V_H'$ is defined as the voltage applied to the V-sawtooth oscillator during the delay period of the preceding cycle, it follows that neither the delay period nor the reference voltage used for D/A conversion is altered.

If the actual average output voltage $\bar{V}_a$ differs by the factor $\gamma = 1 - \epsilon$ from the desired voltage $\bar{V}$ the delay period will be changed by $\Delta \gamma$ in accordance with the formula $$\bar{V} + \bar{V}(1 - \alpha \gamma) = \bar{V}_a + V_H = \gamma \bar{V} + \bar{V}(1 = \alpha \gamma')$$

$$\epsilon = \alpha(\tau - \tau') = \alpha \Delta \gamma, \Delta \gamma = \epsilon/\alpha.$$

In this expression $\tau'$ refers to the delay time in the preceding cycle.

This change of delay time results in a new reference voltage. The ratio of the new reference voltage $V_{ref}$ to the reference voltage $V'_{ref}$ of the preceding cycle is $$V_{ref}/V'_{ref} = e^{\alpha \Delta \tau} = e \epsilon \approx 1/(1-\epsilon) = 1/\gamma \text{ when } \epsilon << 1.$$

This expression shows that any deviation of the actual average output voltage $\bar{V}_a$ by a factor $\gamma$ from the desired average output of the D/A converter causes a change of reference voltage approximately equal to the factor $1/\gamma$.

The binary number K will be increased by one unit if the cycle time $\Delta t$ elapses without any drop of the comparison voltage below the average voltage across the D/A converter; the R-sawtooth oscillator voltage, which begins with the voltage $V_o$ in the new cycle, is used as reference voltage and the V-sawtooth oscillator voltage which begins in the new cycle with $\bar{V}$ volts is used as the new holding voltage.

However, if the comparison voltage is less than the average voltage across the D/A converter at the beginning of the cycle, the binary number K will be reduced by one unit and the final voltage of $B \cdot V_o$ of the R-sawtooth oscillator is used as reference voltage. The final voltage $\bar{V}(1 - \alpha \Delta t)$ of the V-sawtooth oscillator is used as the new holding voltage.

In another embodiment of the delay timer it is advantageous if the lower voltage $V_o$ of the R-sawtooth oscillator is chosen equal to $\bar{V}$, the desired average output voltage of the D/A converter. The reference voltage $V'_{ref}$ defined during the last cycle is then allowed to drop exponentially at the beginning of a cycle at the same rate at which the sawtooth voltage rises on the R-sawtooth oscillator. The voltage on the R-sawtooth oscillator is tapped and supplied to a holding circuit as soon as the aforementioned comparison voltage, whose variation with respect to time is expressed by $$V_V(t) = V'_{ref} e^{-\alpha t}$$

is equal to the actual average output voltage at the D/A converter. This voltage is used in the next cycle as reference voltage for D/A conversion and is used as initial value of the comparison voltage for defining the delay time.

If the actual average voltage $\bar{V}$ at the D/A converter differs by the factor $\gamma$ from the desired voltage $\bar{V}$ this will result in a delay time $\tau$ of $$\tau = -(1/\alpha) \ln (\bar{V}_a/V'_{ref}) = 1/\alpha \ln (\gamma e^{-\alpha \tau'}).$$

The difference between the original and the new delay time therefore amounts to
$\Delta\tau = \tau - \tau' = -(1/\alpha) \ln \gamma$ The ratio of new reference voltage $V_{ref}$ to the reference voltage $V'_{ref}$ of the preceding cycle therefore is $V_{ref}/V'_{ref} = e^{\alpha \Delta \tau} = 1/\gamma$ Deviation of the actual average output voltage of the D/A converter by the factor $\gamma$ from the desired average output voltage therefore causes the reference voltage to change by the factor $1/\gamma$.

If the cycle time $\Delta\tau$ elapses before the comparison voltage has dropped below the average voltage on the D/A converter, the binary number K will be increased by one unit and the initial voltage of the R-sawtooth oscillator is used as reference voltage in the new cycle.

However, if the comparison voltage is less than the average voltage on the D/A converter at the beginning of the cycle the binary number K will be reduced by one unit and the final voltage $B\overline{V}$ of the R-sawtooth oscillator will be used as a reference voltage.

This basic principle of generating reference voltages and the associated definition of the binary number K can also be modified as is explained below.

The frequency of the R-sawtooth oscillator is made equal to an integral multiple n of the inverse cycle time $\Delta t$, i.e. a new sawtooth begins every $\Delta t/n$ secs. The change of R-sawtooth oscillator voltage with respect to time is defined by the expression $V_R(t) = \overline{V} e^{n\alpha t}$ where, as previously, $\alpha = \ln B/\Delta t$. This arrangement ensures that substantial changes of the average output voltage of the D/A converter can be dealt with. One sawtooth, say the m-th, is selected for normal conversion from n sawteeth which occur within one cycle. The first m−1 sawteeth are required if the average output voltage on the D/A converter increases rapidly. The last n-m sawteeth within the cycle are used if the mean output voltage of the D/A converter drops substantially.

The second version of the delay timer is more suitable than the first described version for defining the delay time because the change of reference voltage in the first version is only approximately inversely proportional to the change of the mean output voltage. The changes resulting from multiplying the frequency of the R-sawtooth oscillator are therefore only described for the second version of the delay timer.

The comparison voltage in the delay timer diminishes exponentially from the initial voltage $B^{m-1}V'_{ref}$ i.e. from the reference voltage defined during the last cycle multiplied by the constant factor $e^{\alpha(m-1)\Delta t} = B^{m-1}$, at the same rate at which the voltage increases on the R-sawtooth oscillator. The voltage at the R-sawtooth oscillator is tapped and supplied as new reference voltage to a holding circuit as soon as the previously mentioned comparison voltage, whose reduction with respect to time is therefore defined by the expression $$V_V(t) = V'_{ref} e^{\alpha(m-1)\Delta t} e^{-n\alpha t} \quad (3)$$

is equal to the actual average output voltage of the D/A converter.

At the beginning of the cycle the binary number K is reduced by m−1 and in the course of the cycle is increased by 1 whenever the R-sawtooth oscillator generates a new sawtooth without the comparison voltage having already dropped to the actual mean output voltage $\overline{V}_a$ on the D/A converter. The reduction of the binary counter K by m−1 will just be compensated by the subsequent m−1 increases by 1, if the comparison voltage drops to $\overline{V}_a$ while the R-sawtooth oscillator is generating the m-th sawtooth of this cycle.

The binary number K at the end of the cycle is greater by k−m or—if (k−m) is negative—is smaller by m−k than at the end of the preceding cycle if the comparison voltage drops to $\overline{V}_a$ while the k-th sawtooth of the cycle is just applied to the R-sawtooth oscillator.

In a further modification of the principle of reference voltage generation and the associated definition of the binary number K, the frequency of the R-sawtooth oscillator also is an integral multiple n of the inverse cycle time $\Delta t$, but the sawtooth voltage does not have its minimum value $\overline{V}$ at the beginning of the cycle but rather the value $\overline{V} e^{n\alpha\delta t}$, i.e. it is offset by a specific time $\delta t$ with respect to the beginning of the cycle.

The description of the delay timer in this context will be confined to the most important case when n=2. The few modifications necessary when n>2 will be evident from the preceding modification.

In this special case only one sawtooth of the R-sawtooth oscillator will be completely within one cycle. The comparison voltage in the delay timer drops exponentially from the initial voltage $e^{2\alpha\delta t}V'_{ref}$ i.e. from the reference voltage defined in the last cycle and multiplied by the factor $e^{2\alpha\delta t}$ at the same rate at which the voltage on the R-sawtooth oscillator rises. The voltage is tapped from the R-sawtooth oscillator and is supplied as new reference voltage for the next cycle to a holding circuit as soon as the aforementioned comparison voltage, whose reduction with respect to time is defined by the expression $$V_V(t) = V'_{ref} e^{2\alpha\delta t} e^{-2\alpha t} \quad (4)$$

becomes equal to the actual average voltage at the output of the D/A converter. At the beginning of the cycle the binary number K is reduced by 1 and in the course of the cycle is increased by 1 on each occasion when a new sawtooth begins at the R-sawtooth oscillator without the comparison voltage having already fallen to the actual average output voltage $\overline{V}_a$ at the D/A converter. If the comparison voltage drops to $\overline{V}_a$ volts while the single sawtooth of this cycle completely within it is just applied to the R-sawtooth oscillator, it means that the reduction of the binary number K by 1 at the beginning of the cycle is just compensated by the increase of K by 1 at the beginning of this complete sawtooth. If the comparison voltage drops even before the beginning of this sawtooth to $\overline{V}_a$ ($\tau < \delta t$) the binary number K at the end of the cycle will be 1 less than at the end of the preceding cycle. If the comparison voltage drops to $\overline{V}_a$ volts after the end of the complete cycle ($\tau > \delta t + \Delta t/2$), the binary number K at the end of the cycle will be greater by 1 than at the end of the preceding cycle.

The control of gain by the data themselves as described herein can be readily replaced by external control based on a knowledge of the general properties of such data, more particularly their average amplitude characteristic with respect to time, namely by not allowing the comparison voltage to drop to the average output voltage at the D/A converter but rather to an externally controlled voltage. The reference voltage will not change, if this control voltage is equal to the desired average output voltage on the D/A converter. However, if it becomes greater (or smaller) than $\overline{V}$ by the factor $\gamma$ during one cycle, the reference voltage in all succeeding cycles will be smaller (or larger) by the factor $1/\gamma$. If the control voltage for the duration of two cycles is higher (or lower) than $\overline{V}$ by the factor $\gamma$ the reference voltage after the said two cycles will have been reduced (or increased) by the factor $1/\gamma^2$. If the control voltage is constantly lower (or higher) than $\overline{V}$ by the factor $\gamma$ this will lead to an exponentially rising gain (or attenuation) of the recorded signal. Large changes of gain can thus be achieved by small changes of the control voltage.

Based on the example of the circuit for the analog recording of digitally stored signals described in the aforementioned disclosure by R. J. Loofborrow entitled "Seismic Display/Monitor System", FIG. 1 shows the relationship to known circuits for analog display of digital data of the method described herein.

Referring now to FIG. 1, a register 20 contains the floating point number which is to be converted and which comprises the mantissa A (sign $S_1$) and the exponent E. Three further signals, represented by three further bits from a 3-bit binary counter 26, are transferred to the inputs of an exponent subtraction circuit 24. Binary counter 26 generates signals represented by 3 bits and these in turn represent an integer K. Exponent subtraction circuit 24 generates a digital output signal which represents the value (K−E). This output signal (K−E) is transmitted to a shift register control circuit 28.

Figure 6:
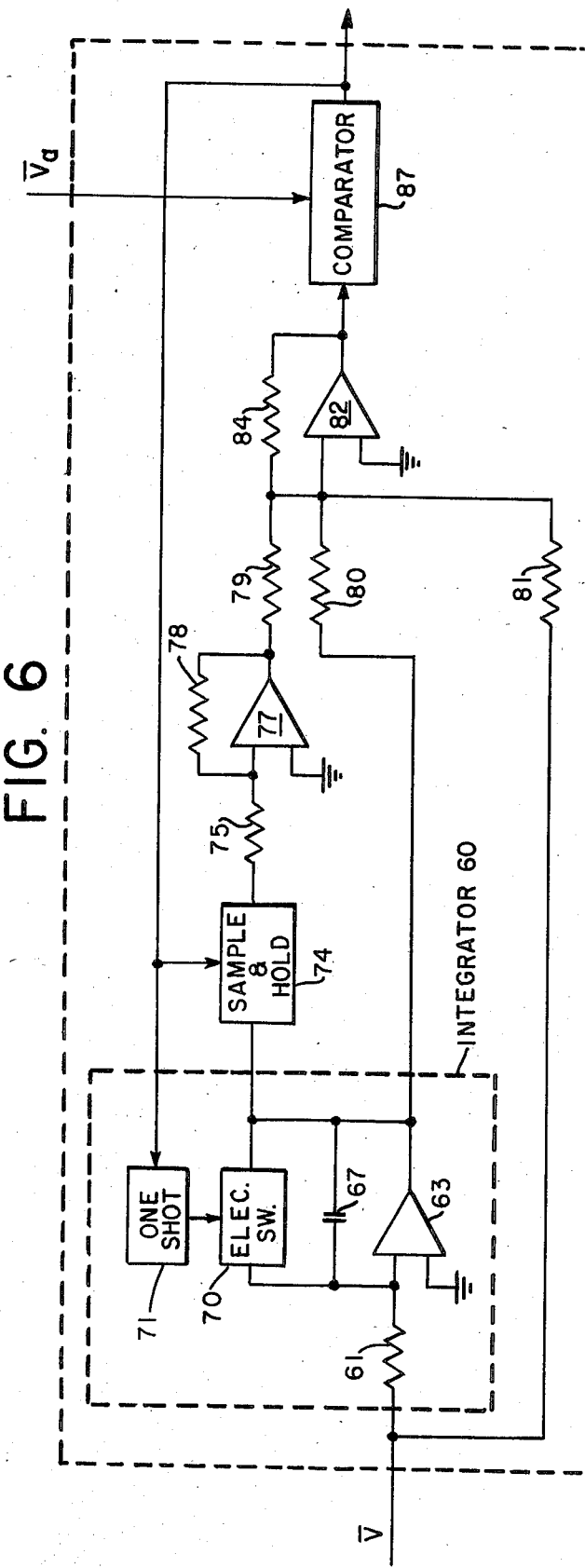
FIGS. 6 and 7 are detailed block diagrams of the delay timer and the R saw-tooth oscillator shown in FIG. 1.

Referring now to FIG. 6, delay timer 46 includes an integrator 60 receiving voltage $\overline{V}$. Integrator 60 includes an input resistor 61 connected to a first input of an amplifier 63 having a second input grounded and an output, a feedback capacitor 67 and an electronic switch 70 connected in parallel between the first input and the output of amplifier 63, and a one-shot multivibrator 71.

A signal provided by integrator 60 is applied to a sample and hold circuit 74 which may be of a conventional type. The output of sample and hold circuit 74 is applied to an input resistor 75 connected to a first input of an amplifier 77 and to a feedback resistor 78. Amplifier 77 has a second input which is grounded and an output connected to feedback resistor 78. Resistors 75, 78 have the same resistance values and cooperate with amplifier 77 so that amplifier 77 functions as a unity gain inverting amplifier.

The outputs of amplifier 77 and of integrator 60 and voltage $\overline{V}$ are applied to summing resistors 79, 80 and 81. Summing resistors 79, 80 and 81 have a common connection to a first input of another amplifier 82 having a second input, connected to ground, and an output. A feedback resistor 84 is connected between the first input and the output of amplifier 82. In essence, elements 79 through 84 sum the signals from integrator 60, amplifier 77 with voltage $\overline{V}$. The signal provided by amplifier 82 is applied to a comparator 87 receiving voltage $\overline{V}_a$.

In operation, voltage $\overline{V}$ is applied through resistor 61 to amplifier 63. As capacitor 67 charges the output of amplifier 63 appears as an integration of voltage $\overline{V}$ and is applied to summing resistor 76 where it is summed with voltage from amplifier 77 corresponding to voltage $V_H$ and with voltage $\overline{V}$. The summed voltages are applied to comparator 87. Due to the inverting effect of amplifier 63, the output of amplifier 82 will be decreasing. As it passes the voltage level of $\overline{V}_W$ the output from comparator 87 changes from a low logic level to a high logic level, causing sample and hold circuit 74 to sample and hold the output from amplifier 63. The change in logic level going in a positive direction triggers a one-shot multivibrator 71 to provide a positive pulse to electronic switch 70 rendering it conductive, causing it to discharge capacitor 67 and the integrating process is repeated over again.

Figure 7:
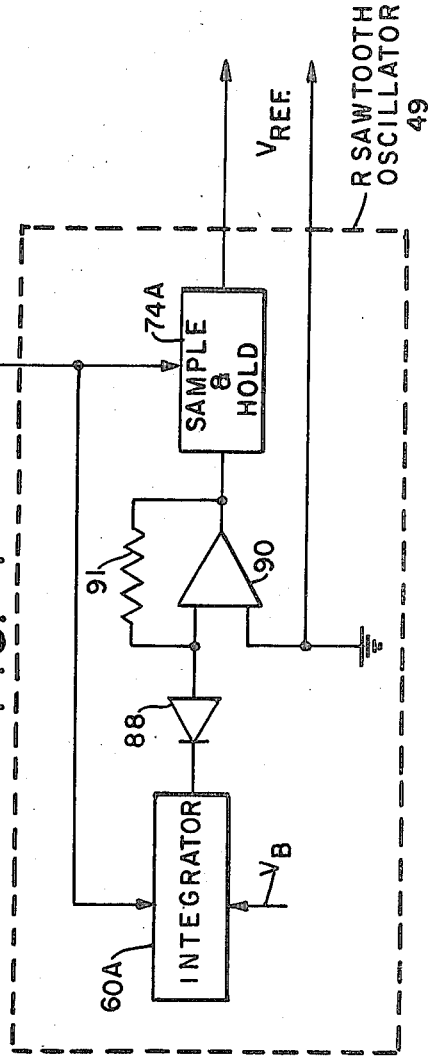

Referring now to FIG. 7, R-sawtooth oscillator 49 includes an integrator 60A, which is similar in construction and operation as integrator 60, receiving the output from comparator 82 in delay timer 46. Integrator 60A also receives and integrates a direct current voltage $V_B$ which is optional. Depending on the magnitude of the reference voltage that is desired, it would be feasible to use voltage $\overline{V}$. The output from integrator 60A is applied to a diode 88 which in turn applies it to a first input of an amplifier 90 having a second input, connected to ground and an output. A feedback resistor 91 connected between the first input and the output of amplifier 90. The output of amplifier 90 is also connected to a sample and hold circuit 74A which is of the same type as sample and hold circuit 74 and which receives the signal provided by comparator 87. Sample and hold circuit 74A provides voltage $V_{ref}$ when taken with respect to ground.

Shift register control circuit 28 transmits an output control signal to shift register 22 which is adapted to shift by multiples of 3 bits. The digital signals in shift register 22 as represented by the shifted binary digits (or bits) are then transferred to a 15-bit digital/analog converter 30. If desired, an analog output voltage from a digital/analog converter 30 can be transferred to the input of an amplifier 36 which has a gain G=8. In FIG. 1 amplifier 36 is shown in broken lines because amplifier 36 is not required as long as the analog voltage has an adequate amplitude. If amplifier 36 is not required, the analog output voltage of digital/analog converter 30 can be transferred directly to one input of a demultiplixer 38. Demultiplexer 38 is provided with a plurality of output channels. A single analog output voltage of digital/analog converter 30 is connected by demultiplexer 38 directly to the input of the associated and known holding circuit (not shown). The voltage is transferred from the holding circuit to a known filter circuit (not shown) and from there to a galvanometer oscilloscope or the like (not shown) where it is converted into an oscillogram or line diagram representing a visible display or recording of relevant seismic signals.

The analog output voltage from digital/analog converter 30 is also applied to the input of an averaging circuit 40. Averaging circuit 40 transmits an analog output signal $\overline{V}_a$ to a further input of a delay timer 46. In another embodiment of the apparatus, each of the output signals of demultiplexer 38 can be connected directly to a separate input of adding means 48 after being filtered in the associated filter circuit. The output of adding means 48 is directly connected to the input of the averaging circuit 40. The system comprising an R-sawtooth oscillator 49 and delay timer 46 to generate the reference voltage $V_{ref}$ required for D/A conversion is specially marked by a box shown in broken lines.

As may be seen by reference to FIG. 1, delay timer 46 is provided with between two and four inputs, depending on the method employed. Both inputs, which occur in all modifications described herein, are provided for supplying the optimum average output voltage $\overline{V}$ on the D/A converter for analog recording and for supplying the actual average output voltage $\overline{V}_a$. Delay timers 46 of the second kind also require an input for the reference voltage which was defined in the immediately preceding cycle and is utilized in the present cycle. A further input through which the beginning of a new sawtooth of R-sawtooth oscillator 49 is signalled to delay timer 46 will also be required if the frequency of R-sawtooth oscillator 49 is an integral multiple of the inverse cycle time. The binary number K which was reduced at the beginning of the cycle is increased by one unit in the 3-bit binary counter 26 if the aforementioned signal reaches delay timer 46 before the comparison voltage has dropped to $\overline{V}_a$. The output of delay timer 46 which then extends to the R-sawtooth oscillator 49 is provided to transmit a signal which ensures that the instantaneous voltage is sampled from the R-sawtooth oscillator 49 and is supplied as reference voltage to a holding circuit which is part of the sawtooth oscillator 49. The next FIGS. 2, 3, 4, and 5 show for every two successive cycles the change of voltage at R-sawtooth oscillator 49 (top half of the Figures) and the change of comparison voltage in delay timer 46 (bottom half of the Figures). Values which are newly defined in each cycle are marked by two primes, one prime or no prime. For example, $V''_{ref}$ refers to the reference voltage used in the first illustrated cycle (it was defined in the preceding cycle). $V'_{ref}$ is the reference voltage defined in the first illustrated cycle and utilized in the second illustrated cycle while $V_{ref}$ represents the reference voltage which was defined in the second illustrated cycle and was utilized in the succeeding cycle which is, however, not shown.

Figure 2:
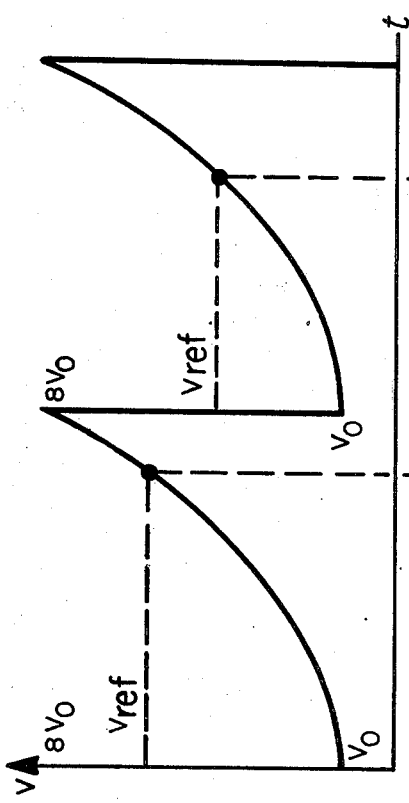
Figure 2:
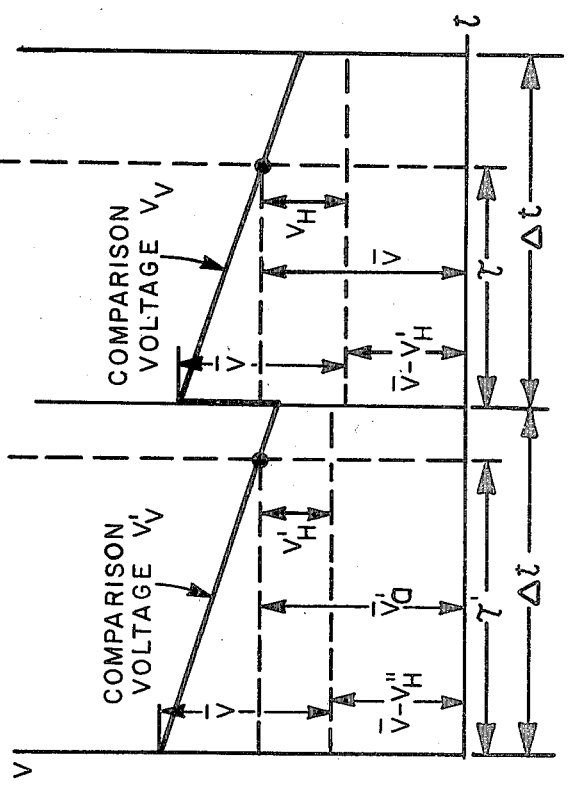

FIG. 2 shows the conditions which occur as described for the first version of delay timer 46. The comparison voltage $V'_V$, being obtained from the difference of the voltage $\overline{V}$ and the holding voltage $V''_H$ as defined in the preceding cycle and by addition of a sawtooth voltage which diminishes linearly from the voltage $\overline{V}$, drops to a voltage $\overline{V}_a$. The voltage $V'_{ref}$ obtained at this time at R-sawtooth oscillator 49 is utilized as reference voltage during the next cycle for D/A conversion. The voltage $V'_H$ on the V-sawtooth oscillator which is retained at the same time is intended for defining the comparison voltage $V_V$ during the next cycle.

Figure 3:
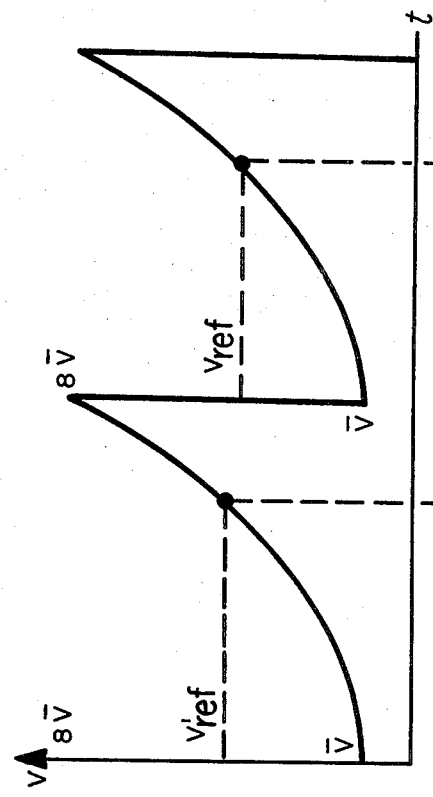
FIGS. 2, 3, 4 and 5 show the form of different signals occurring in different embodiments of the system shown in FIG. 1.
Figure 3:
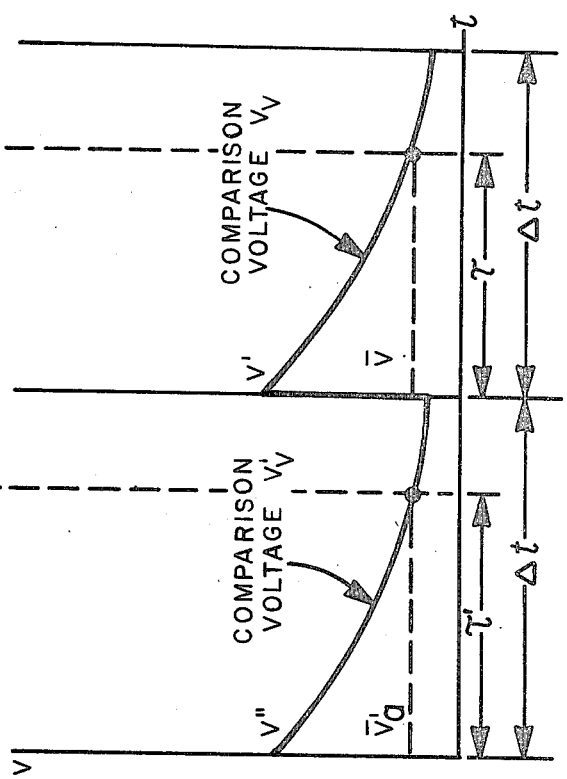

The conditions which occur in terms of the description of the second version of delay timer 46 are shown in FIG. 3. In this case the comparison voltage diminishes exponentially from the reference voltage $V''_{ref}$, which is applied to R-sawtooth oscillator 49 if the comparison voltage is equal to the actual average output voltage $\overline{V}'_a$ at the D/A converter, is used as reference voltage for the next cycle and also functions as initial value of the comparison voltage for the next cycle which defines the reference voltage $V_{ref}$ used in the succeeding cycle that is not shown.

Figure 4:
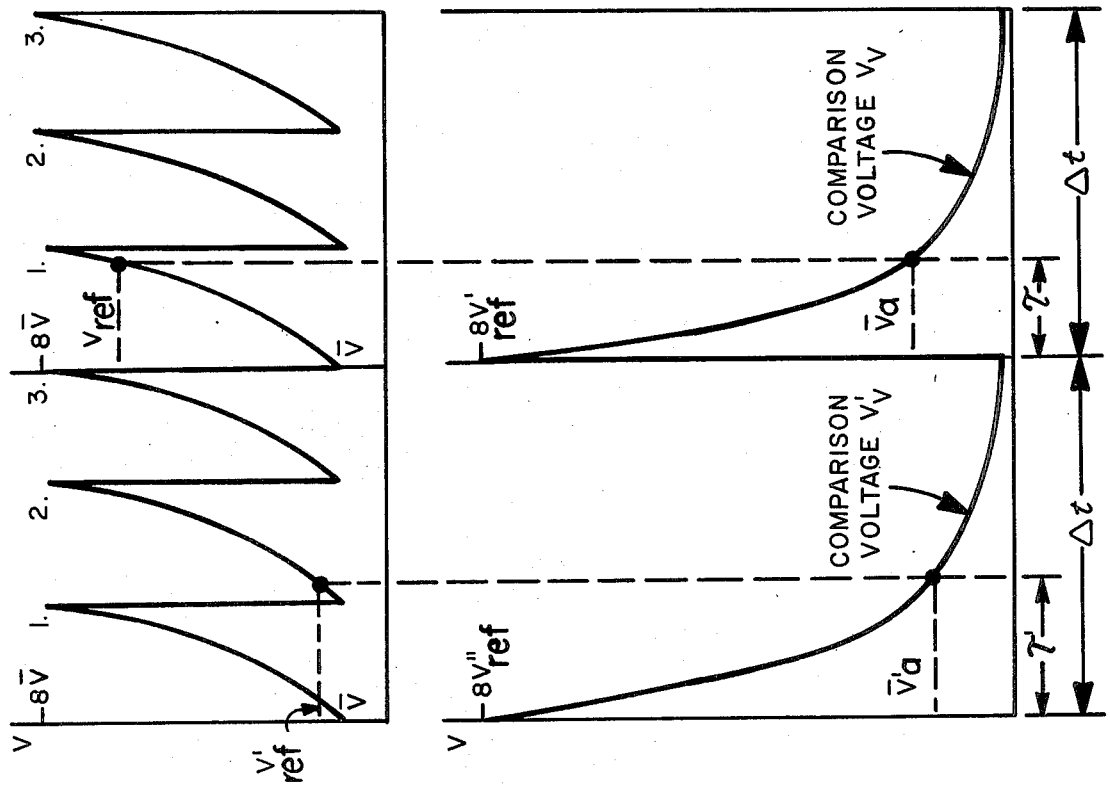

FIG. 4 represents the voltage on the R-sawtooth oscillator 49 and the comparison voltage in delay timer 46 as obtained from the assumption that a new sawtooth begins on R-sawtooth oscillator 49 not every $\Delta t$ seconds as previously, but every $\Delta t/3$ seconds (n=3). Furthermore, m=2 was selected, i.e. the middle of the three sawteeth in each cycle is used for normal conversions. In this case the comparison voltage drops exponentially from eight times the comparison voltage $V''_{ref}$ as defined in the preceding cycle, i.e. from $8\,V''_{ref}$. The voltage $V'_{ref}$, which is applied to R-sawtooth oscillator 49 if the comparison voltage is equal to the actual average output voltage $\overline{V}'_a$ on D/A converter 30, is used as reference voltage for the next cycle. When multiplied by the factor 8 this voltage is also used as initial value for the exponentially decreasing comparison voltage $V_V$ in the next cycle. In the case described in this context when m=2, the binary number K must be reduced by 1 at the beginning of the cycle. A signal which is triggered after $\Delta t/3$ seconds at the beginning of the second sawtooth causes the binary number K to be again increased by 1. If the delay time is between $\Delta t/3$ and $2\Delta t/3$ as in the first illustrated cycle, there will be no overall change of the binary number K. In the second cycle the comparison voltage will already drop down to $\overline{V}_a$ while the first sawtooth is still applied to R-sawtooth oscillator 49. The reduction of the binary number K by 1 at the beginning of the cycle therefore remains unchanged in this case.

Figure 5:
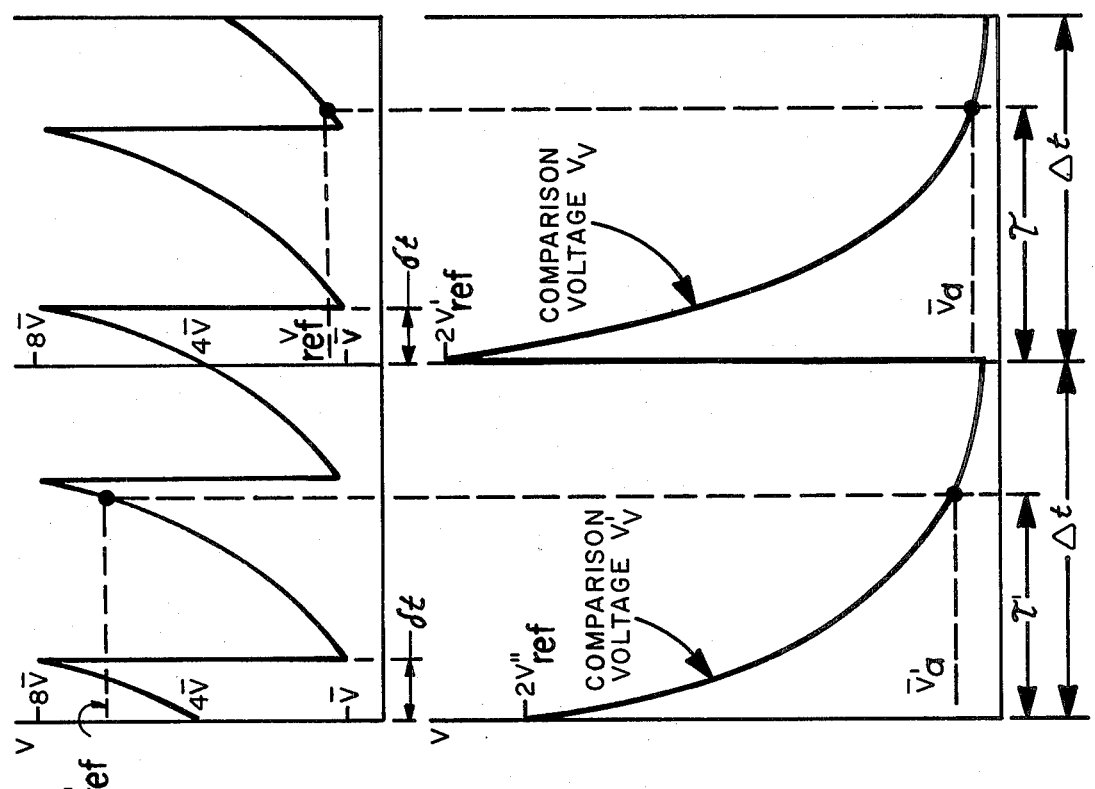

FIG. 5 shows the characteristic of the R-sawtooth voltage and of the comparison voltage in the event that the sawtooth voltage minimum does not coincide with the beginning of the cycle but is shifted by the time $\delta t$ with respect to the beginning of the cycle. In the case, illustrated for $\delta t = \delta t/6$, the voltage at R-sawtooth oscillator 49 has already reached $4\,\overline{V}$ at the beginning of the cycle. The comparison voltage then decreases exponentially from twice the value of the reference voltage $V''_{ref}$ as defined in the preceding cycle. The voltage $V'_{ref}$ applied to R-sawtooth oscillator 49, when the comparison voltage is equal to the actual average output voltage $\overline{V}'_a$ on the D/A converter 30, is used as reference voltage for the next cycle. When it is multiplied with the factor 2 it also serves as initial value for the exponentially decreasing comparison voltage in the next cycle. At the beginning of the cycle the binary number K is reduced by 1. The binary number K is again increased by 1 by a signal which is triggered after $\delta t$ seconds at the beginning of the new sawtooth. No overall change of the binary number K will occur if the delay time is between $\delta t$ and $\delta t + \Delta t/2$ as in the first illustrated cycle. In the second illustrated cycle, the comparison voltage drops to $\overline{V}_a$ volts only after $\delta t + \Delta t/2$ seconds. The binary number K, which was initially reduced by 1, was increased twice by 1 through the signals triggered at the beginning of both sawteeth—after $\delta t$ and $\delta t + \Delta t/2$ seconds. At the end of the cycle this number is higher by 1 than at the end of the preceding cycle.

What is claimed is:

1. An improved method for converting and steplessly compressing digital values of signals with a wide dynamic range into analog signals and for subsequent visual display and monitoring purposes, each digital value being represented as floating point number in the form $$Q = \pm AB^{K-E}$$

wherein A represents a mantissa, B represents a radix— preferably 2,4,8,16—, E represents an exponent, and K represents a binary number—, subjecting said floating point number Q to a D/A-converter-, and providing a variable reference voltage $V_R$ for controlling the digital-analog conversion of said floating point number Q; said improvement comprising the steps of (1) periodically generating said reference voltage $V_R$ in a sawtooth oscillator in a manner that the amplitude rises exponentially from a predetermined minimum value $V_o$ to a predetermined maximum $BV_o$ value during each reference voltage cycle;

(2) synchronizing said reference voltage cycle in accordance with said conversion cycle so that the reference voltage is equal or an integer fraction of said conversion cycle;

(3) providing a voltage $V_{ref}$ taken from said voltage $V_R$ at an instant of time, determined by a delay timer, within the reference voltage cycle, said instant of time being controlled by averages of the previously determined analog signal; and (4) supplying said voltage $V_{ref}$ of said reference voltage $V_R$ to a holding circuit for performing the digital/analog conversion of said floating point number Q during said synchronized reference voltage cycle.

2. Method according to claim 1, characterized in that the voltage $V_R$ supplied by the R-sawtooth-oscillator increases exponentially from a minimum voltage $V_o$ to a maximum voltage $BV_o$ at least once with in one conversion cycle, and that a signal is transmitted to the delay timer whenever a new sawtooth of the R-sawtooth-oscillator commences.

3. Method according to claim 2, characterized in that the minimum value of the sawtooth voltage coincides with the beginning of a cycle.

4. Method according to claim 3, characterized in that the delay time is reached when a comparison voltage decreases to the average output voltage on the D/A converter.

5. Method according to claim 4, characterized in that the binary number K required for normalizing the floating point numbers representing the data is increased by 1 if the delay time is longer than the cycle time, the initial voltage of the R-sawtooth oscillator being selected as the new reference voltage and that the binary number K is reduced by 1 if the comparison voltage at the beginning of the cycle is less than the mean output voltage on the D/A converter, the final voltage of the R-sawtooth oscillator being selected as new reference voltage.

6. Method according to claim 5, characterized in that the comparison voltage is generated from the sum of a constant voltage and of a voltage which decreases linearly from the initial voltage $\overline{V}$ and is derived from the comparison voltage sawtooth oscillator (V-sawtooth oscillator) the constant voltage being formed by reduction of the voltage $\overline{V}$ by the amount of the voltage $V'_H$ which is applied to the V-sawtooth oscillator during the preceding cycle when the delay time is reached.

7. Method according to claim 5, characterized in that the comparison voltage decreases exponentially from the reference voltage $V'_{ref}$ defined in the last cycle at the same rate at which the voltage on the R-sawtooth oscillator rises, the minimum voltage $V_o$ of the R-sawtooth oscillator being equal to the desired average output voltage $\overline{V}$ on the D/A converter.

8. Method according to claim 7, characterized in that one sawtooth (the m-th) of n sawteeth on the R-sawtooth oscillator within one cycle is used as the operating sawtooth for normal conversions, that the minimum voltage $V_o$ of the R-sawtooth oscillator is equal to $\overline{V}$ and that the comparison voltage $V_V$ decreases exponentially from an initial voltage at the same rate at which the voltage on the R-sawtooth oscillator rises, the said initial voltage being selected so that until the beginning of the operating sawtooth the comparison voltage drops to the comparison voltage $V'_{ref}$ as defined in the last cycle, that a binary number K is reduced by $(m-1)$ at the beginning of the cycle and is increased by 1 on each occasion when a new sawtooth commences on the R-sawtooth oscillator without the comparison voltage having already decreased to the average output voltage on the D/A converter.

9. Method according to claim 6, characterized by the use of a comparison voltage which has decreased to a freely chosen externally supplied voltage, which may be dependent on time.

10. Method according to claim 7, characterized by the use of a comparison voltage which has decreased to a freely chosen externally supplied voltage, which may be dependent on time.

11. Method according to claim 8, characterized by the use of a comparison voltage which has decreased to a freely chosen externally supplied voltage, which may be dependent on time.

* * * * *